United States Patent
Arnold et al.

(10) Patent No.: US 11,555,844 B2
(45) Date of Patent: Jan. 17, 2023

(54) HIGH ACCURATE CONTACT RESISTANCE MEASUREMENT METHOD USING ONE OR MORE DIODES

(71) Applicant: Infineon Technologies AG, Neubiberg (DE)

(72) Inventors: Ralf Arnold, Poing (DE); Lukas Niedergriese, Stuggart (DE)

(73) Assignee: Infineon Technologies AG, Neubiberg (DE)

( * ) Notice: Subject to any disclaimer, the term of this patent is extended or adjusted under 35 U.S.C. 154(b) by 782 days.

(21) Appl. No.: 16/023,306

(22) Filed: Jun. 29, 2018

(65) Prior Publication Data
US 2020/0003824 A1 Jan. 2, 2020

(51) Int. Cl.
G01R 31/26 (2020.01)
G01R 27/08 (2006.01)
G01R 27/20 (2006.01)
G01R 31/28 (2006.01)

(52) U.S. Cl.
CPC ......... *G01R 31/2632* (2013.01); *G01R 27/08* (2013.01); *G01R 27/205* (2013.01); *G01R 31/2894* (2013.01)

(58) Field of Classification Search
None
See application file for complete search history.

(56) References Cited

U.S. PATENT DOCUMENTS

| | | | | |
|---|---|---|---|---|
| 7,080,332 | B2* | 7/2006 | Kwak | G06F 30/367 |
| | | | | 703/2 |
| 7,453,282 | B2 | 11/2008 | Arnold | |
| 2006/0107242 | A1* | 5/2006 | Boerstler | G01R 31/2632 |
| | | | | 702/117 |
| 2006/0186896 | A1 | 8/2006 | Arnold | |
| 2018/0143231 | A1* | 5/2018 | Shim | G01R 27/08 |

OTHER PUBLICATIONS

Broz, Jerry J. ,et al; Controlling Contact Resistance; https://www.evaluationengineering.com/controlling-contact-resistance; May 1, 2004; pp. 1-10.

(Continued)

*Primary Examiner* — Nasima Monsur
(74) *Attorney, Agent, or Firm* — Eschweiler & Potashnik, LLC

(57) ABSTRACT

A method for determining an emission coefficient of a device under test (DUT) using a test circuit comprises coupling a parameter measurement circuit associated with the test circuit to an input pin associated with the DUT, wherein the input pin is coupled to a diode element within the DUT and performing voltage and current measurements associated with the input pin using the parameter measurement circuit. In some embodiments, the method further comprises determining a plurality of contact resistance values respectively based on the voltage and current measurements and an emission coefficient estimate using a contact resistance estimation circuit; and determining an emission coefficient associated with the DUT based on the determined plurality of contact resistance values using an emission coefficient determination circuit.

22 Claims, 10 Drawing Sheets

(56) References Cited

OTHER PUBLICATIONS

Electronics Believer, Your Online Teacher; What is Source and Sink Current; https://electronicsbeliever.com/what-is-source-and-sink-current/; Feb. 10, 2015; pp. 1-5.
Parametric Measurement Handbook; Chapter 3: Source/Monitor Unit (SMU) Fundamentals; Third Edition, Mar. 2012; Agilent Technologies; pp. 1-21.
Analog Devices; PPMU Circuit—AD53508; Analog Devices; 2001; pp. 1-8.

* cited by examiner

HIGH ACCURATE CONTACT RESISTANCE MEASUREMENT METHOD USING ONE OR MORE DIODES

FIELD

The present disclosure relates to the field of semiconductor device testing, and in particular, to a method for determining an emission coefficient associated with a semiconductor device.

BACKGROUND

To ensure the function and evaluate the performance of semiconductor devices, testing is an important step for the semiconductor devices. The tests need to obtain a high level of accuracy while finishing in a short amount of time to keep the production test costs low. In order to perform accurate testing on a device, accurate knowledge of various parameters associated with the device, for example, an emission coefficient of a diode associated therewith, is required. Further, during testing, some unknown variables may be introduced by the test equipment, for example, contact resistance which greatly affects the accuracy of testing. Therefore, in order to get accurate results in testing and validation of devices, it is important to have an accurate knowledge of the emission coefficient of the device (or a diode associated therewith) and/or the contact resistance, before the testing is performed on the device.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
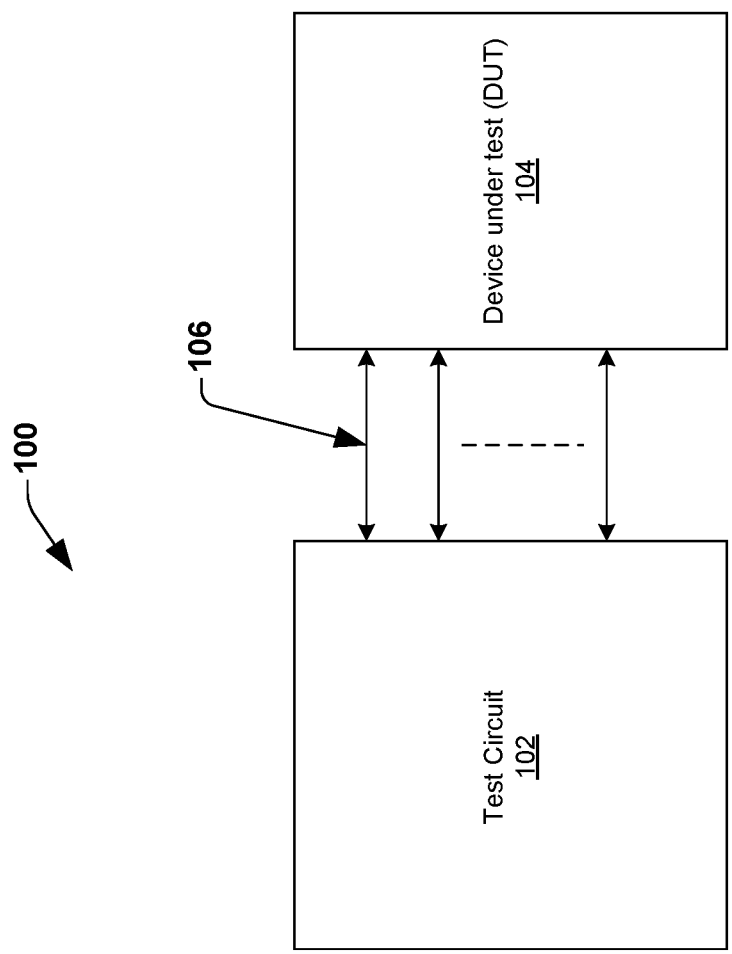
FIG. 1 depicts a simplified block diagram of a test system, according to one embodiment of the disclosure.

In one embodiment of the disclosure, a method for determining an emission coefficient is disclosed. The method comprises performing voltage and current measurements and calculating a plurality of contact resistance values based on an estimate of the emission coefficient using the voltage and current measurements. The method further comprises determining a resistance difference, wherein the resistance difference is a difference between a greatest and a smallest value within the plurality of calculated contact resistance values. In some embodiments, the method further comprises adjusting the emission coefficient estimate and repeating the calculation of the plurality of contact resistance values and the resistance difference with the adjusted emission coefficient estimate, if the resistance difference does not fulfill a stop condition. In addition, the method comprises determining the emission coefficient based on the current emission coefficient estimate or a previous emission coefficient estimate, if the resistance difference fulfills the stop condition.

In one embodiment of the disclosure, a method for determining an emission coefficient of a device under test (DUT) using a test circuit is disclosed. The method comprises coupling a parameter measurement circuit associated with the test circuit to an input pin associated with the DUT, wherein the input pin is coupled to a diode element within the DUT and performing voltage and current measurements associated with the input pin using the parameter measurement circuit. The method further comprises determining a plurality of contact resistance values respectively based on the voltage and current measurements and an emission coefficient estimate using a contact resistance estimation circuit. In addition, the method comprises determining an emission coefficient associated with the input pin of the DUT based on the determined plurality of contact resistance values using an emission coefficient determination circuit.

In one embodiment of the disclosure, a test circuit configured to determine emission coefficients of a device under test (DUT) is disclosed. The test circuit comprises a parameter measurement circuit configured to perform voltage and current measurements associated with an input pin of the DUT and a contact resistance estimation circuit configured to determine a plurality of contact resistance values respectively based on the voltage and current measurements and an emission coefficient estimate. The test circuit further comprises an emission coefficient determination circuit configured to determine an emission coefficient associated with the DUT based on the determined plurality of contact resistance values.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, testing is an important step for semiconductor devices to ensure the function of devices and evaluate the performance of the devices. Further, as indicated above, it is important to have an accurate knowledge of the emission coefficients of the device (or a Diode Element associated therewith) and/or the contact resistance, before the testing is performed on the device inputs/outputs. The device that is being tested is sometimes referred to herein as a device under test (DUT). The emission coefficient $\eta$ (eta) is a variable to account for imperfections in the junctions within a diode element. It expresses the deviation of the diode curve from the ideal Shockley model (with $\eta=1$). In some embodiments, the emission coefficient of an input/output pin of a DUT comprises an emission coefficient associated with a diode element coupled to the input/output pin of the DUT. In some embodiments, the diode element may include an electrostatic discharge (ESD) diode and/or a parallel circuit of multiple diodes and/or parasitic diodes e.g. from a driver transistor. In current implementations, during testing or validation, the value of the emission coefficient for a normal diode is usually estimated to be between 1 and 2.

However, the emission coefficient associated with an input/output pin of a DUT could differ depending on the input/output (I/O) structure of the pin. For example, in some embodiments, an ESD structure of the input/output pin and a driver structure (e.g. the parasitic bulk diode) associated with the input/output pin together forms a combined diode element with different emission coefficient. Therefore, in order to get accurate values of the emission coefficients of a device or a DUT, a method and an apparatus to determine the emission coefficient of a diode element associated with the device is proposed in this disclosure. In some embodiments, the proposed emission coefficient determination method enables one to determine accurate values of the emission coefficients for the various pins of the DUT terminals, thereby facilitating an accurate simulation model derivation of the DUT. In some embodiments, the determination of accurate values of the emission coefficients of a DUT is also essential for the determination of accurate contact resistances of the DUT terminals. In the embodiments described throughout the disclosure, the terms emission coefficient and eta are used interchangeably and are construed to have the same meaning.

In some embodiments, the term contact resistance refers to a contribution to the total resistance of a system which can be attributed to the contacting interfaces of electrical leads and connections (e.g., a physical connection between a test system and the DUT) as opposed to the intrinsic resistance. In current implementations, testing and validation of the DUT is done based on an estimated value for the contact resistance. For example, in some embodiments, the contact resistance is estimated based on getting a feedback about the resistance of the contactors associated with the test equipment. Further, in some embodiments, the contact resistance contributed by a test equipment is measured on a device once, and the same contact resistance value is used for multiple productions boards of the device. However, the contact resistance contributed by a test equipment is variable over temperature and also dependent on the usage/worn-out factor of the test equipment contactors (e.g., pogo contacts, probe needles, sockets etc.). Therefore, utilizing an estimated contact resistance for testing leads to inaccurate results, which further leads to yield loss because potentially functional devices are failing the validation due to the large error range.

In order to overcome the above disadvantages, a method and an apparatus to determine a contact resistance contributed by a test equipment based on measurements on a DUT is proposed in this disclosure. The key idea that is utilized herein is to determine the contact resistance based on measurements across a diode element associated with an input pin of the DUT. As indicated above, the diode element may include an electrostatic discharge (ESD) diode or a parallel circuit of multiple diodes or parasitic diodes e.g. from a driver transistor. In some embodiments, the proposed method to measure the contact resistance requires information on the emission coefficient of the diode element. In some embodiments, the proposed contact resistance determination method is based on taking measurements associated with the input pin of the DUT. In some embodiments, the proposed method enables to calculate an accurate value for the contact resistance at the input pin of the DUT before every validation.

FIG. 1 depicts a simplified block diagram of a test system 100, according to one embodiment of the disclosure. The test system 100 comprises a test circuit 102 and a device under test (DUT) 104. In some embodiments, the test circuit 102 is configured to perform measurements on the DUT 104, in order to evaluate the function and performance of the DUT 104. In some embodiments, the DUT 104 comprises a device that is being tested. In some embodiments, the DUT 104 comprises an integrated circuit (IC) comprising a plurality of pins, for example, control pins, I/O pins, interface pins etc. In the embodiments described herein, the various pins associated with the DUT 104 are referred to as an input pin for the ease of reference and is not to be construed as limiting. In other embodiments, however, the DUT 104 can include, other devices, for example, discrete components like diodes etc. In some embodiments, the test circuit 102 is configured to couple to an input pin associated with the DUT 104 via a test connection 106. In a case when the DUT 104 comprises a discrete component, the term "input pin" may refer to an input port (or lead) of the component. In some embodiments, a test connection 106 connects an input pin of the DUT 104 to a test channel of the test circuit 102. In some embodiments, the test circuit 102 may be configured to perform measurements associated with one or more input pins of the DUT 104 in parallel. In such embodiments, the test circuit 102 may comprise a plurality of test connections 106 in order to couple the various pins of the DUT 104 with one test channel each of the test circuit 102.

In some embodiments, the test circuit 102 is configured to perform measurements associated with an input pin of the DUT 104 via a respective test connection 106 associated therewith. In some embodiments, the test circuit 102 comprises measuring instruments associated with each test channel, in order to perform measurements associated with a respective test connection 106 or a respective input pin of the DUT 104. In some embodiments, the test circuit 102 further comprises one or more processors (e.g., microcontrollers) configured to process the measured parameters and evaluate the performance of the input pins. In some embodiments, the test connections 106 comprise contactors by which the DUT pins are contacted, for example, test sockets for inserting the DUTs, pogo contacts, probe needles etc. In some embodiments, the test circuit 102 is configured to determine an emission coefficient associated with an input pin of the DUT 104 (or with respect to one or more pins of the DUT 104, when the DUT 104 comprises a plurality of input pins). In some embodiments, the emission coefficient η is a variable to account for imperfections in the junctions within a diode element.

Figure 2:
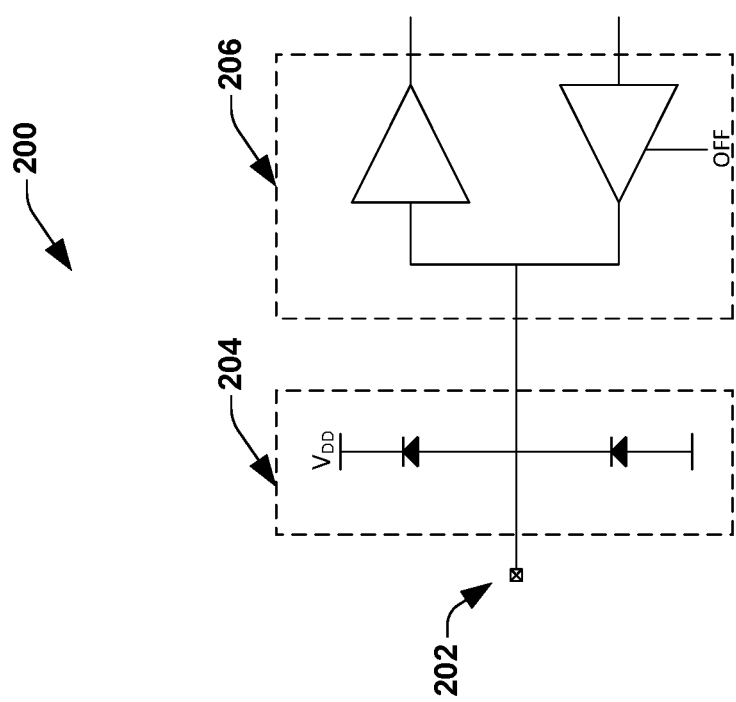
FIG. 2 depicts a simplified diagram of a DUT having an ESD protection structure associated therewith, according to one embodiment of the disclosure.

In some embodiments, determining the emission coefficient of the DUT 104 comprises determining the emission coefficient of a diode element associated with the DUT 104. In some embodiments, DUT 104 may comprise a diode element associated with one or more input pins of the DUT 104. The diode element may include an electrostatic discharge (ESD) diode, as illustrated in FIG. 2. However, in other embodiments, the diode element may comprise a parallel circuit of multiple diodes, parasitic diodes, for example, from a driver transistor etc. Referring to FIG. 2, FIG. 2 depicts a simplified diagram of a DUT 200 having an ESD protection structure 204 associated therewith. The DUT 200 further comprises a contact pad 202 associated with an input pin and an input/output buffer circuit 206. In some embodiments, the DUT 200 can be included within the DUT 104 in FIG. 1. In some embodiments, the test circuit 102 may be configured to determine the emission coefficient associated with an input pin of the DUT 104 based on one or more measurements associated with the input pin (e.g., the contact pad 202 in FIG. 2). In some embodiments, the test circuit 102 may be configured to determine the emission coefficient associated with an input pin of the DUT, in accordance with a predefined emission coefficient determination method, further details of which are given in embodiments below.

In some embodiments, during testing, the test connections 106 of the test circuit 102 contribute a contact resistance. In some embodiments, other parasitic resistances between the test circuit 102 and the DUT 104 also contribute to the contact resistance. Therefore, in some embodiments, the test circuit 102 is further configured to determine a contact resistance at an input pin of the DUT 104 based on measurements (e.g., voltage and current measurements) across the diode element associated with an input pin of the DUT 104, further details of which are given in embodiments below. In some embodiments, the test circuit 102 is configured to perform measurements associated with the DUT 104 (or an input pin associated therewith) based on coupling to a contact pad (e.g., the contact pad 202 in FIG. 2) associated with an input pin of the DUT 104. In some embodiments, a voltage measured across the diode element (e.g., at the contact pad 202 in FIG. 2) includes a voltage drop across the diode element and a voltage drop due to the contact resistance. In some embodiments, the test circuit 102 may be configured to perform voltage and current measurements based on forcing current to the input pin of the DUT 104 and measuring a corresponding voltage at the input pin of the DUT 104. However, in other embodiments, the test circuit 102 may be configured to perform voltage and current measurements based on forcing voltage to the input pin of the DUT 104 and measuring a corresponding current at the input pin of the DUT 104.

Figure 3A:
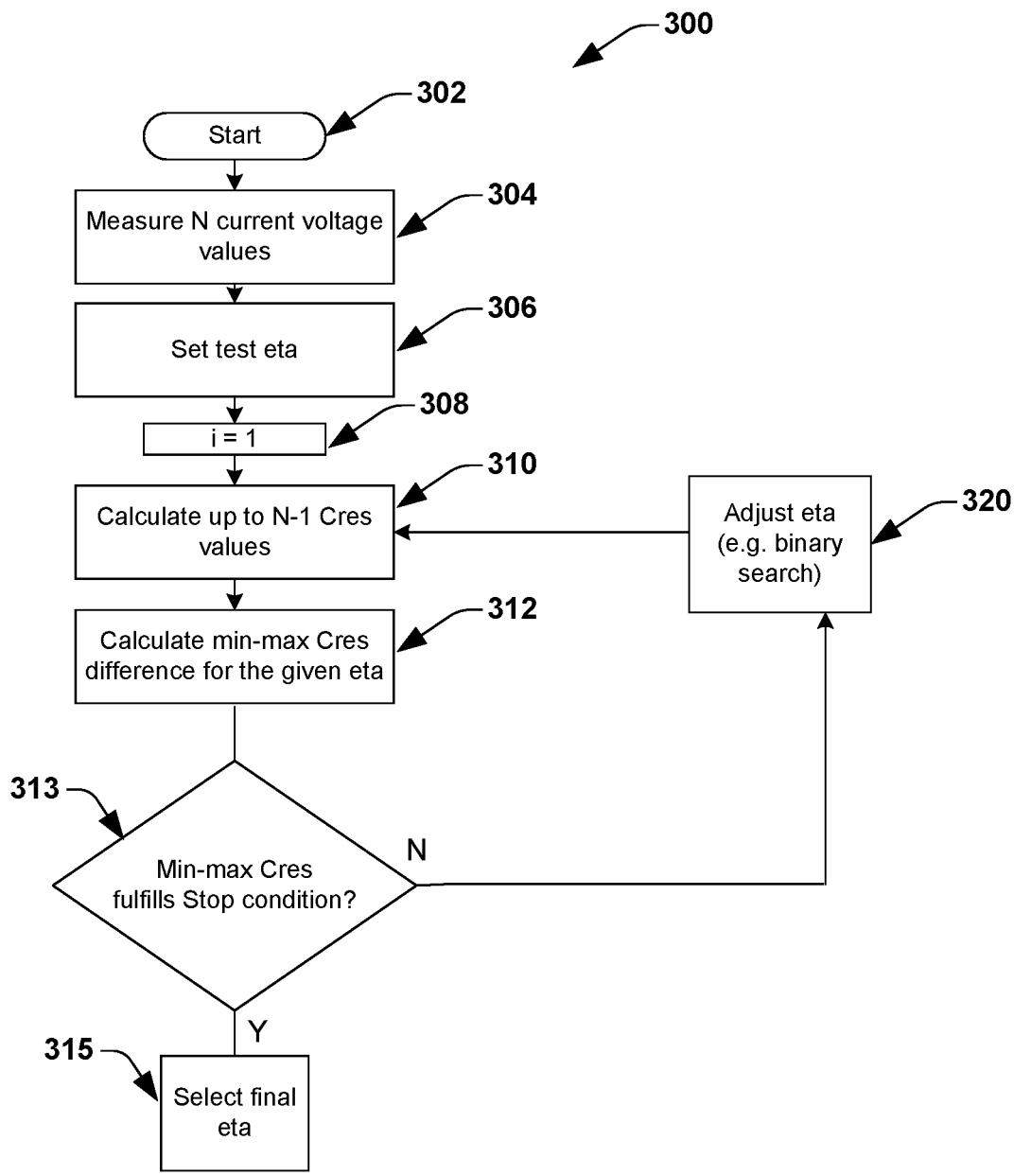
FIG. 3a illustrates a flowchart of an emission coefficient determination method that is utilized to determine an emission coefficient associated with a DUT terminal, according to one embodiment of the disclosure.

FIG. 3a illustrates a flowchart of an emission coefficient determination method 300 that is utilized to determine an emission coefficient associated with a DUT, according to one embodiment of the disclosure. In some embodiments, the emission coefficient determination method 300 may be implemented within the test circuit 102 in FIG. 1, in order to determine the emission coefficient associated with an input pin of the DUT 104. Therefore, the emission coefficient determination method 300 is explained herein with reference to the test circuit 102 in FIG. 1. However, in other embodiments, the emission coefficient determination method 300 may be implemented in any other test circuits and is not to be construed to be limiting. At 302, an instruction to determine an emission coefficient associated with an input pin of the DUT 104 is received at the test circuit 102. At 304, a plurality of current and voltage measurements (e.g., N) associated with the input pin of the DUT 104 is performed at the test circuit 102. At 306, an estimate of the emission coefficient (e.g., test eta) is initiated, or "set", at the test circuit 102. At 308, a loop count (e.g., i) is set to 1 at the test circuit 102 (e.g., in a memory circuit associated therewith).

At 310, a plurality of contact resistance values (Cres) associated with the input pin of the DUT 104 is calculated at the test circuit 102, respectively based on the plurality of current and voltage measurements (measured at 304). In some embodiments, the plurality of voltage and current measurements comprises a plurality of emission coefficient parameter sets, each emission coefficient parameter set comprising voltages and currents required to determine a respective contact resistance value. In some embodiments, the test circuit 102 may be configured to determine each of the contact resistance vales based on a predefined contact resistance relation, further details of which are given in embodiments below. In such embodiments, each of the emission coefficient parameter sets comprises two voltages and two currents (e.g., two voltage current pairs), in order to determine the contact resistance value based on the predefined contact resistance relation. However, in other embodiments, the test circuit 102 may be configured to determine the contact resistances differently. At 312, a resistance difference (e.g., min-max Cres difference) comprising a difference between a greatest and a smallest value within the group of calculated contact resistance values is calculated at the test circuit 102. At 313, a determination whether the calculated resistance difference fulfills a stop condition is performed within the test circuit 102. In some embodiments, the stop condition may be based on a predefined threshold value. In some embodiments, the stop condition may be based on the resistance difference and a previously determined resistance difference, further details of which are given in an embodiment below. If yes at 313 (i.e., the calculated resistance difference fulfills the stop condition), the method proceeds to 315, where the final emission coefficient associated with the input pin of the DUT 104 is determined. In some embodiments, the emission coefficient estimate (initiated or set at 306) is determined as the final emission coefficient. However, in other embodiments, a previous emission coefficient estimate is determined as the final emission coefficient, further details of which are given in an embodiment below. If No at 313 (i.e., the stop condition is not fulfilled), the method proceeds to 320, where the emission coefficient estimate is adjusted. Upon adjusting the emission coefficient estimate, the method proceeds to 310, where the loop is repeated. In some embodiments, adjusting the emission coefficient estimate comprises changing the emission coefficient estimate according to a search algorithm dependent on previously determined resistance differences. For example, in some embodiments, adjusting the emission coefficient estimate comprises increasing the emission coefficient estimate if the resistance difference is smaller than a previously determined resistance difference and decreasing the emission coefficient estimate if the resistance difference is greater than a previously determined resistance difference. However, in other embodiments, the emission coefficient estimate may be adjusted differently.

Figure 3B:
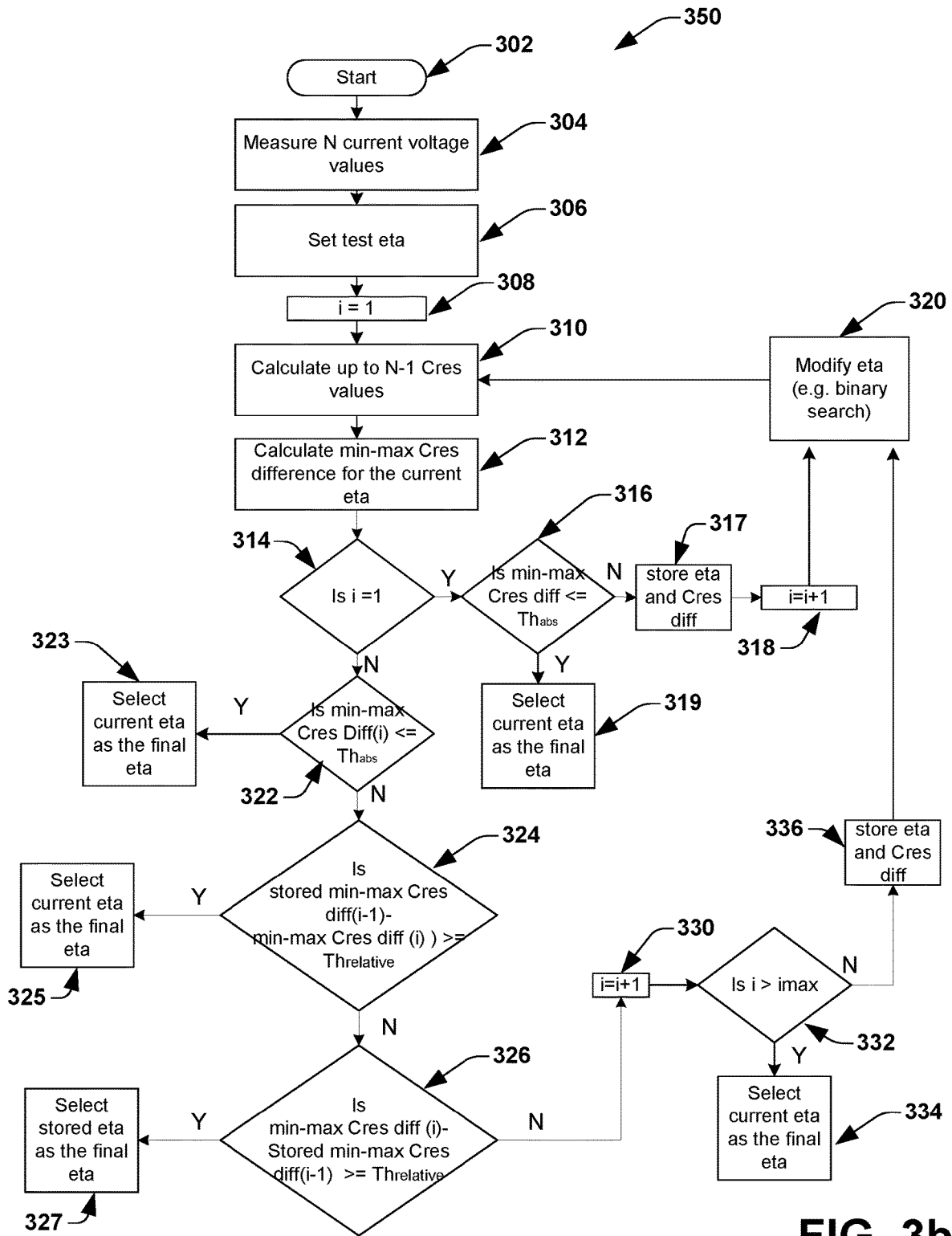
FIG. 3b illustrates a flowchart of an emission coefficient determination method that is utilized to determine an emission coefficient associated with a DUT terminal, according to another embodiment of the disclosure.

FIG. 3b illustrates a flowchart of an emission coefficient determination method 350 that is utilized to determine an emission coefficient associated with a DUT, according to one embodiment of the disclosure. In some embodiments, the emission coefficient determination method 350 depicts one possible way of implementation of the method 300 in FIG. 3a. In some embodiments, the emission coefficient determination method 350 may be implemented within the test circuit 102 in FIG. 1, in order to determine the emission coefficient associated with an input pin of the DUT 104. Therefore, the emission coefficient determination method 350 is explained herein with reference to the test circuit 102 in FIG. 1. However, in other embodiments, the emission coefficient determination method 350 may be implemented in any other test circuits and is not to be construed to be limiting. At 302, an instruction to determine an emission coefficient associated with an input pin of the DUT 104 is received at the test circuit 102. At 304, a plurality of current and voltage measurements (e.g., N) associated with the input pin of the DUT 104 is performed at the test circuit 102. At 306, an initial estimate of the emission coefficient (e.g., test eta) is set at the test circuit 102. At 308, a loop count (e.g., i) is set to 1 at the test circuit 102 (e.g., in a memory circuit associated therewith).

At 310, a plurality of contact resistance values (Cres) associated with input pin of the DUT 104 is calculated at the test circuit 102, respectively based on the plurality of current and voltage measurements (measured at 304) and the test eta. In some embodiments, the plurality of voltage and current measurements comprises a plurality of emission coefficient parameter sets, each emission coefficient parameter set comprising voltages and currents required to determine a respective contact resistance value. In some embodiments, the test circuit 102 may be configured to determine each of the contact resistance vales based on a predefined contact resistance relation, further details of which are given in embodiments below. In such embodiments, each of the emission coefficient parameter sets comprises two voltages and two currents (e.g., two voltage current pairs), in order to determine the contact resistance value based on the predefined contact resistance relation. However, in other embodiments, the test circuit 102 may be configured to determine the contact resistances differently. At 312, a resistance difference (e.g., min-max Cres difference) comprising a difference between a greatest and a smallest value within the group of calculated contact resistance values is calculated at the test circuit 102. At 314, a determination whether the loop count is 1 is performed at the test circuit 102. If yes at 314, the method proceeds to 316, where a determination whether the resistance difference is less than a predefined absolute threshold (e.g., $Th_{abs}$) is made at the test circuit 102. In some embodiments, the determination whether the resistance difference is less than a predefined absolute threshold comprises a stop condition. If yes at 316, the current emission coefficient estimate is determined as the final emission coefficient associated with the input pin of the DUT 104 and the method concludes. If No at 316, the method proceeds to 317, where the eta and the resistance difference values are stored within the test circuit 102 (e.g., in a memory circuit associated therewith). Upon storing the eta and the resistance difference, the method proceeds to 318, where the loop count is incremented. Upon incrementing the loop count, the method further proceeds to 320, where the emission coefficient estimate is adjusted.

If No at 314, the method proceeds to 322. In some embodiments, a No at 314 indicates that the loop count has been previously incremented and that the emission coefficient has been adjusted. At 322, a determination whether the resistance difference is less than a predefined absolute threshold (e.g., $Th_{abs}$) is made at the test circuit 102. In some embodiments, the determination whether the resistance difference is less than a predefined absolute threshold comprises a stop condition. If yes at 322, the method proceeds to 323, where the current emission coefficient estimate is determined as the final emission coefficient associated with the input pin of the DUT 104 and the method concludes. If No at 322, the method proceeds to 324, where a determination whether the current resistance difference is less than a previous stored resistance difference at least by a predefined relative threshold value (e.g., $Th_{relative}$) is made at the test circuit 102. In some embodiments, the determination whether the current resistance difference is less than a previous resistance difference at least by the predefined relative threshold also comprises the stop condition.

If yes at 324, the method proceeds to 325, where the current emission coefficient estimate is determined as the final emission coefficient associated with the input pin of the DUT 104 and the method concludes. If No at 324, the method proceeds to 326, where a determination whether the previous stored resistance difference is less than the current resistance difference at least by a predefined relative threshold value (e.g., $Th_{relative}$) is made at the test circuit 102. In some embodiments, the determination whether the previous stored resistance difference is less than the current resistance difference at least by the predefined relative threshold also comprises the stop condition. In yes at 326, the method proceeds to 327, where the previous stored emission coefficient estimate is determined as the final emission coefficient associated with the input pin of the DUT 104 and the method concludes. If No at 326, the method proceeds to 330, where the loop count is incremented within the test circuit 102. At 332, a determination whether the current loop count is greater than a maximum loop count is made at the test circuit 102. If yes at 332, the method proceeds to 334, where the current emission coefficient estimate is determined as the final emission coefficient associated with the input pin of the DUT 104 and the method concludes. If No at 332, the method proceeds to 336, where the eta and the resistance difference is stored within the test circuit 102 (e.g., in a memory circuit associated therewith). Upon storing the eta and the resistance difference, the method proceeds to 320, where the emission coefficient estimate is adjusted. Upon adjusting the emission coefficient estimate, the method proceeds to 310, where the loop is repeated within the test circuit 102. In some embodiments, adjusting the emission coefficient at 320, and repeating the acts at 310 and 312 are repeated until the resistance difference fulfills the stop condition (e.g., yes at 316, 322, 324 or 326) or until the loop count reaches the max loop count (e.g., yes at 332).

Figure 4:
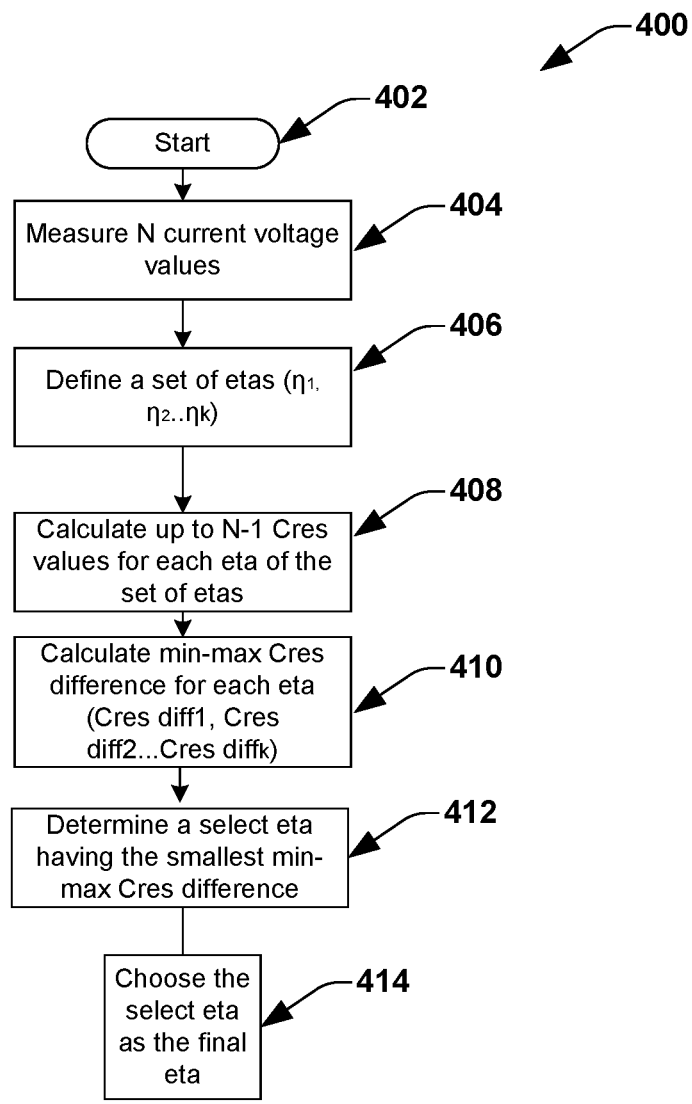
FIG. 4 illustrates a flowchart of an emission coefficient determination method that is utilized to determine an emission coefficient associated with a DUT terminal, according to yet another embodiment of the disclosure.

FIG. 4 illustrates a flowchart of an emission coefficient determination method 400 that is utilized to determine an emission coefficient associated with a DUT, according to one embodiment of the disclosure. In some embodiments, the emission coefficient determination method 400 may be implemented within the test circuit 102 in FIG. 1, in order to determine the emission coefficient associated with an input pin of the DUT 104. Therefore, the emission coefficient determination method 400 is explained herein with reference to the test circuit 102 in FIG. 1. However, in other embodiments, the emission coefficient determination method 400 may be implemented in any other test circuits and is not to be construed to be limiting. At 402, an instruction to determine an emission coefficient associated with an input pin of the DUT 104 is received at the test circuit 102. At 404, a plurality of current and voltage measurements (e.g., N measurements) associated with the input pin of the DUT 104 is performed at the test circuit 102.

At 406, a set of emission coefficients (eta) (e.g., $\eta_1$, $\eta_2$ . . . $\eta_k$) is defined at the test circuit 102. In some embodiments, the set of emission coefficients are predefined and stored in a memory circuit associated with the test circuit 102. In other embodiments, the set of emission coefficients may be defined within the test circuit 102 based on some predefined criteria. Alternately, in some embodiments, the set of emission coefficients may be provided to the test circuit 102 from the outside, for example, by an operator. At 408, a plurality of contact resistance values (N Cres) associated with the input pin of the DUT 104 is calculated at the test circuit 102, respectively based on the plurality of current and voltage measurements (measured at 404), for each emission coefficient of the set of emission coefficients (e.g., $\eta_1$, $\eta_2$ . . . $\eta_k$) is determined at the test circuit 102 (See Table 1 below). In some embodiments, the plurality of voltage and current measurements comprises a plurality of emission coefficient parameter sets, each emission coefficient parameter set comprising voltages and currents required to determine a respective contact resistance value. In some embodiments, the test circuit 102 may be configured to determine each of the contact resistance vales based on a predefined contact resistance relation, further details of which are given in embodiments below. In such embodiments, each of the emission coefficient parameter sets comprises two voltages and two currents (e.g., two voltage current pairs), in order to determine the contact resistance value based on the predefined contact resistance relation. However, in other embodiments, the test circuit 102 may be configured to determine the contact resistances differently. At 410, a resistance difference (e.g., the min-max Cres difference) comprising a difference between a greatest and a smallest value within the plurality of calculated contact resistance values for each eta of the set of etas (emission coefficients), is calculated at the test circuit 102. At 412, a select eta having a smallest resistance difference is determined from the set of etas at the test circuit 102. At 414, the select eta is chosen as the emission coefficient associated with the input pin of the DUT 104. In some embodiments, the test circuit 102 may be configured to tune the select eta, in order to get a more accurate eta value. In such embodiments, the test circuit 102 may be configured to define another set of etas based on the selected eta and repeat the method 400. In some embodiments, the another set of etas may be obtained by modifying the selected eta by a predefined step range. In some embodiments, the test circuit 102 may be configured to define new set of etas and repeat the method 400 until a desired accuracy for eta is achieved.

In some embodiments, Table 1 below illustrates one possible way of implementation of the emission coefficient determination method 400.

| Eta  | 2.2      | 2.3      | 2.4      | 2.5      | 2.6      |            |
|------|----------|----------|----------|----------|----------|------------|
| Cres | 10.12216 | 9.901127 | 8.485905 | 9.459064 | 9.238032 | ←($V_1$, $I_1$) |
|      | 10.08181 | 9.874255 | 8.493592 | 9.45914  | 9.251583 | ←($V_2$, $I_2$) |
|      | 10.07375 | 9.877496 | 8.500679 | 9.484989 | 9.288735 | ←($V_3$, $I_3$) |
|      | 10.05191 | 9.865331 | 8.526899 | 9.492182 | 9.305607 | ←($V_4$, $I_4$) |
|      | 10.01195 | 9.833797 | 8.5395   | 9.477492 | 9.29934  | ←($V_5$, $I_5$) |
|      | 10.00486 | 9.834131 | 8.551652 | 9.492674 | 9.321945 | ←($V_6$, $I_6$) |
|      | 9.968717 | 9.804602 | 8.553413 | 9.476371 | 9.312256 | ←($V_7$, $I_7$) |

-continued

| Eta | 2.2 | 2.3 | 2.4 | 2.5 | 2.6 | |
|---|---|---|---|---|---|---|
| | 9.98267 | 9.824499 | 8.564592 | 9.508158 | 9.349987 | ←($V_8$, $I_8$) |
| | 9.955345 | 9.802558 | 8.578538 | 9.496984 | 9.344196 | ←($V_9$, $I_9$) |
| | 9.972645 | 9.824765 | 8.582219 | 9.529006 | 9.381126 | ←($V_{10}$, $I_{10}$) |
| | 9.920627 | 9.777247 | 8.601793 | 9.490486 | 9.347105 | ←($V_{11}$, $I_{11}$) |
| Max − Min | 0.201532 | 0.123881 | 0.115887 | 0.069942 | 0.143094 | |

Table 1 illustrates a first iteration of the emission coefficient calculation process with predefined etas 2.2, 2.3, 2.4, 2.5 and 2.6. For each eta, a plurality of contact resistance values (e.g., Cres) is calculated based on a respective plurality of voltage and current measurements (e.g., ($V_1$, $I_1$), ($V_2$, $I_2$) ... ($V_{11}$, $I_{11}$)). In particular, for each eta, 11 values of contact resistances are calculated respectively based on 11 voltage and current measurements. Each of the plurality of voltage and current measurements are shown as ($V_1$, $I_1$), ($V_2$, $I_2$) ... ($V_{11}$, $I_{11}$) in Table 1 for the ease of reference and is not to be construed to be limited to include just one voltage and one current. For example, in some embodiments, each of the plurality of voltage and current measurements ($V_1$, $I_1$), ($V_2$, $I_2$) ... ($V_{11}$, $I_{11}$) in Table 1 may comprise two voltages and two currents, in order to determine the corresponding Cres values based on a predefined contact resistance relation, further details of which are given in an embodiment below. Further, for each eta, a resistance difference (e.g., min-max) comprising a difference between the greatest and the smallest value within the plurality of calculated contact resistance values is calculated. From above, the smallest min-max difference is determined (i.e., 0.069942) and the eta corresponding to the smallest min-max difference (i.e., 2.5) is determined as the emission coefficient. In some embodiments, in order to get a more accurate eta, a new set of etas may be defined with a smaller step range based on the current eta, for example, 2.52, 2.53. 2.54 etc. and the emission coefficient calculation process may be repeated. In some embodiments, the emission coefficient determination process is repeated for multiple new sets of etas until a desired accuracy for eta is achieved.

Figure 5:
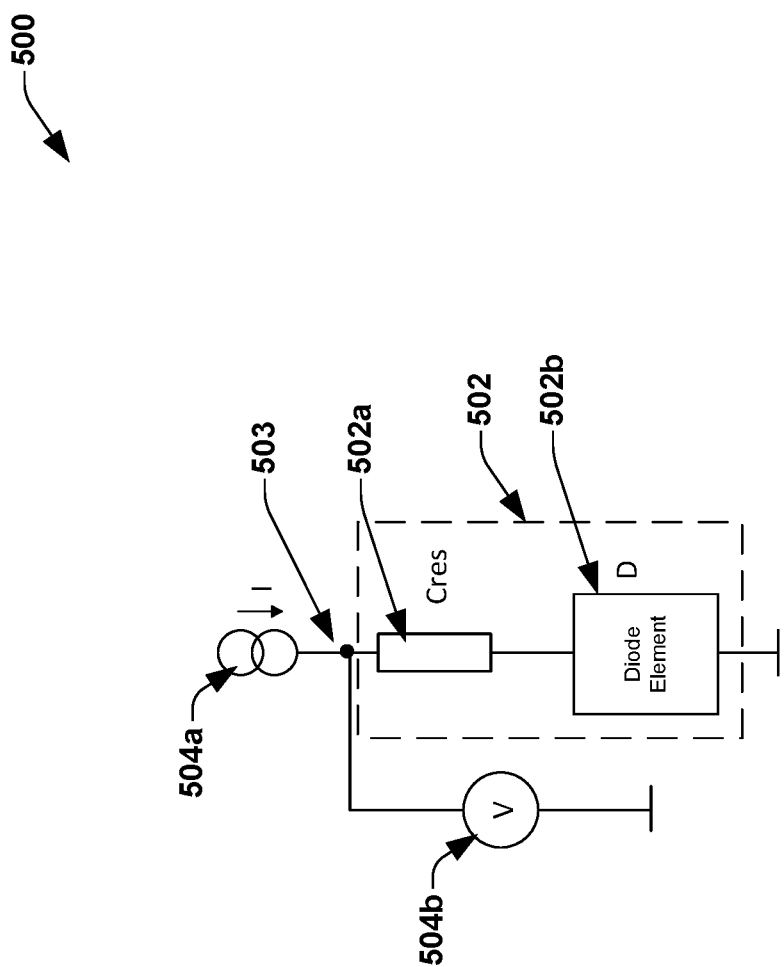
FIG. 5 illustrates one possible simplified test setup configured to measure a contact resistance associated with a DUT terminal, according to one embodiment of the disclosure.

FIG. 5 illustrates one possible simplified test setup 500 configured to measure a contact resistance associated with a DUT, according to one embodiment of the disclosure. The test setup 500 comprises a device under test 502, a current source 504a configured to force current I into an input pin 503 of the DUT 500 and a voltage measurement circuit 504b configured to measure a voltage at the input pin 503 of the DUT 500. In some embodiments, the current source 504a and the voltage measurement circuit 504b may be part of the test circuit 102 in FIG. 1 and the DUT 502 may be included within the DUT 104 in FIG. 1. In this example embodiment, the test setup is shown to include a current source 504a and a voltage measurement circuit 504b, in order to perform the voltage and current measurements. However, in other embodiments, the test setup may include a voltage source and a current measurement circuit, in order to perform the voltage and current measurements. In some embodiments, the contact resistance value may be determined based on information of the voltage measured $V_{measured}$ at the voltage measurement circuit 502b and the induced current I. In some embodiments, a voltage measured $V_{measured}$ at the input pin 503 of the DUT 500 comprises a voltage drop due to a contact resistance Cres 502a and the voltage across the diode element D 502b.

Therefore, in one example embodiment, the contact resistance Cres associated with the input/output pin of the DUT 500 may be obtained by subtracting the voltage drop across the diode element D 502b from the overall voltage measured at the voltage measurement circuit 502b and then dividing the results by the induced current I, as given below:

$$R = \frac{V_{measured} - V_D}{I} \quad (1)$$

Where R is the contact resistance, $V_D$ is the voltage drop across the diode, $V_{measured}$ is the overall voltage measured at the voltage measurement circuit 502b and I is the forced/induced current.

In some embodiments, the diode voltage $V_D$ is derived from the Shockley diode equation as given below:

$$I_D = I_S\left(e^{\frac{V_D}{\eta * V_T}} - 1\right) \quad (2)$$

$$\frac{I_D}{I_S} = e^{\frac{V_D}{\eta * V_T}} - 1 \quad (3)$$

$$\ln\left(\frac{I_D}{I_S} + 1\right) = \frac{V_D}{\eta * V_T} \quad (4)$$

$$V_D = \eta * V_T * \ln\left(\frac{I_D}{I_S} + 1\right) \quad (5)$$

where $I_D$ is the current through the diode, $I_S$ is the saturation current, η is the emission coefficient to account for the imperfection of a real diode, $V_D$ is the voltage drop across the diode, $V_T$ is the temperature voltage given by the formula $$V_T = \frac{kT}{q}$$

(approximately 26 mV for room temperature), k is the Boltzmann constant $1.38*10^{-23}$ J/K, q is the elementary charge $1.602*10^{-19}$ C and T is the temperature in Kelvin. The +1 within the ln in equation (5) can be left out because the saturation current $I_S$ is very small (usually in the range of $10^{-12}$ ... $10^{-6}$ A) and therefore the fraction is way larger than the 1. Based on this assumption, equation (5) may be modified as given below:

$$V_D \approx \eta * V_T * \ln\left(\frac{I_D}{I_S}\right) \quad (6)$$

Substituting equation (6) in equation (1), the contact resistance may be derived as given below:

$$R = \frac{V_{measured} - \left(\eta * V_T * \ln\left(\frac{I}{I_S}\right)\right)}{I} \quad (7)$$

In some embodiments, the test circuit 102 in FIG. 1 may be configured to determine the contact resistance based on implementing equation (7).

Alternately, in another embodiment, the contact resistance associated with the input pin 503 of the DUT 502 may be obtained by taking two sets of voltage/current measurements associated with the input pin 503 of the DUT 504, as given below:

$$V_1 = C_{RES} * I_1 + r_{D1} * I_1 \quad (8)$$

$$V_2 = C_{RES} * I_2 + r_{D2} * I_2 \quad (9)$$

$$\Delta V = V_2 - V_1 = C_{RES} * (I_2 - I_1) + (r_{D2} - r_{D1}) * (I_2 - I_1) \quad (10)$$

$$\frac{V_2 - V_1}{I_2 - I_1} = C_{RES} + \Delta r_D = \Delta R \quad (11)$$

$$\Delta R = \frac{V_2 - V_1}{I_2 - I_1} \quad (12)$$

Where $\Delta R$ includes the contact resistance $C_{RES}$ and change in diode resistance $\Delta r_D$.

In some embodiments, the change in diode resistance $\Delta r_D$ is derived using Shockley equation as given below:

$$\Delta r_d = \frac{\eta * V_T * \ln\left(\frac{I_2}{I_S}\right) - \eta * V_T * \ln\left(\frac{I_1}{I_S}\right)}{I_2 - I_1} \quad (13)$$

$$\Delta r_d = \frac{\eta * V_T \left[\ln\left(\frac{I_2}{I_S}\right) - \ln\left(\frac{I_1}{I_S}\right)\right]}{I_2 - I_1} \quad (14)$$

$$\Delta r_d = \frac{\eta * V_T * \ln\left(\frac{I_2}{I_S} * \frac{I_S}{I_1}\right)}{I_2 - I_1} \quad (15)$$

$$\Delta r_d = \frac{\eta * V_T * \ln\left(\frac{I_2}{I_1}\right)}{I_2 - I_1} \quad (16)$$

From equation (16), it can be seen that saturation current $I_S$ is cancelled out.

From equation (11) above, $C_{RES}$ can be derived as given below:

$$C_{RES} = \Delta R - \Delta r_d \quad (17)$$

Substituting equation (16) in equation (17), we get:

$$C_{RES} = \frac{V_2 - V_1}{I_2 - I_1} - \frac{\eta * V_T * \ln\left(\frac{I_2}{I_1}\right)}{I_2 - I_1} \quad (18)$$

$$C_{RES} = \frac{V_2 - V_1 - \eta * V_T * \ln\left(\frac{I_2}{I_1}\right)}{I_2 - I_1} \quad (19)$$

where $I_1$, $I_2$ are the currents through the diode, $I_1$, $I_2$ are the measured voltages at the input pin 503 of the DUT 504, $\eta$ is the emission coefficient to account for the imperfection of a real diode, $V_T$ is the temperature voltage given by the formula $$V_T = \frac{kT}{q}$$

(approximately 26 mV for room temperature), k is the Boltzmann constant $1.38*10^{-23}$ J/K, q is the elementary charge $1.602*10^{-19}$ C and T is the temperature in Kelvin. In some embodiments, the equation (19) is referred to as a predefined contact resistance relation. In some embodiments, the test circuit 102 in FIG. 1 may be configured to implement equation (19), in order to determine the contact resistance associated with the input pin of the DUT 104. In some embodiments, equation (7) or equation (19) may be utilized to determine the plurality of contact resistance values for implementing the emission coefficient determination methods 300, 350 or 400 above.

Figure 6:
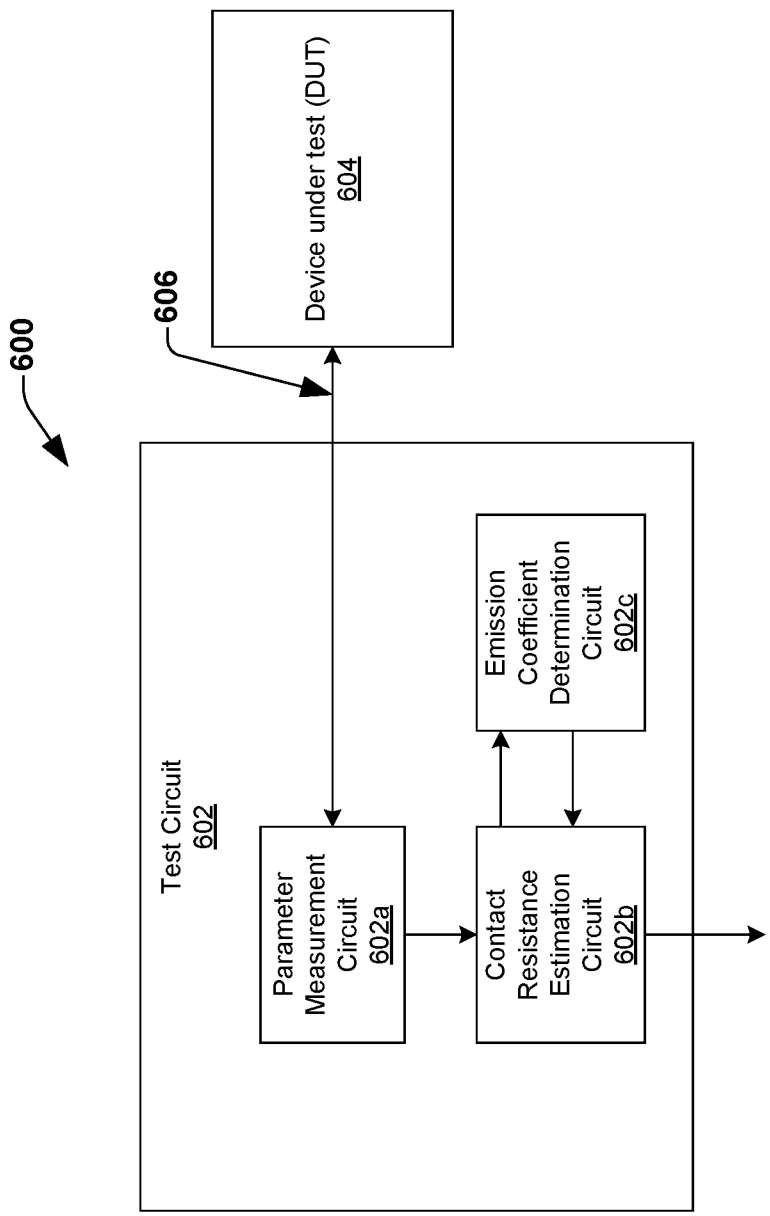
FIG. 6 illustrates an example implementation of a test system, according to one embodiment of the disclosure.

FIG. 6 illustrates an example implementation of a test system 600, according to one embodiment of the disclosure. In some embodiments, the test system 600 depicts one possible way of implementation of the test system 100 in FIG. 1. The test system 600 comprises a test circuit 602 and a device under test (DUT) 604. In some embodiments, the test circuit 602 is configured to perform measurements on the DUT 604, in order to evaluate the function and performance of the DUT 604. In some embodiments, the test circuit 602 is configured to perform measurements on the DUT 604 based on utilizing a test connection 606 that connects the DUT 604 to a test channel of the test circuit 302. In this embodiment, the test circuit 602 is shown to include only one test connection 606 couple to the DUT 604 (or an input pin associated therewith). However, in other embodiments, the test circuit 602 may include more than one test connection configured to couple to one or more input pins of the DUT 604. In some embodiments, the test circuit 602 comprises a parameter measurement circuit 602a, a contact resistance estimation circuit 602b and an emission coefficient determination circuit 602c. In some embodiments, the parameter measurement circuit 602a, the contact resistance estimation circuit 602b and the emission coefficient determination circuit 602c may comprise a plurality of parameter measurement circuits, a plurality of contact resistance estimation circuits and a plurality of emission coefficient determination circuits respectively associated therewith, in order to perform measurements on a plurality of input pins of the DUT 604. In some embodiments, the test circuit 602 in configured to determine an emission coefficient associated with an input pin of the DUT 604. In some embodiments, the input pin of the DUT 604 may comprise a diode element associated therewith and the emission coefficient $\eta$ is a variable to account for imperfections in the junctions within a diode element, as explained above with respect to FIG. 1.

In a first example embodiment, the test circuit 602 is configured to determine the emission coefficient associated with an input pin of the DUT, based on implementing the predefined emission coefficient determination method 300 or 350 explained above with respect to FIG. 3a and FIG. 3b respectively. In such embodiments, the parameter measurement circuit 602a is configured to perform a plurality of voltage and current measurements (e.g., act 304 in FIG. 3a and FIG. 3b). In some embodiments, the parameter measurement circuit 602a is configured to perform the plurality of voltage and current measurements based on forcing a plurality of currents to the input pin of the DUT 604 and measuring corresponding voltages at the input pin of the DUT 604. However, in other embodiments, the parameter measurement circuit 602a may be configured to perform the plurality of voltage and current measurements based on forcing a plurality of voltages at the input pin of the DUT 604 and measuring corresponding currents at the input pin of the DUT 604.

The emission coefficient determination circuit 602c is configured to initiate with an emission coefficient estimate and provide the emission coefficient estimate to the contact resistance estimation circuit 602b (e.g., the act 306 in FIG. 3a and FIG. 3b). In some embodiments, the emission coefficient estimate is predefined and stored in a memory circuit associated with the emission coefficient determination circuit 602c. Alternately, in other embodiments, the emission coefficient estimate may be provided to the emission coefficient determination circuit 602c from outside, for example, by an operator. In some embodiments, the emission coefficient estimation circuit 602c is further configured to set a loop count to 1 (e.g., act 308 in FIG. 3a and FIG. 3b). In some embodiments, the contact resistance estimation circuit 602b is configured to determine a plurality of contact resistance values respectively based on the plurality of voltage and current measurements and the emission coefficient estimate (e.g., the act 310 in FIG. 3a and FIG. 3b). In some embodiments, the contact resistance estimation circuit 602b may be configured to determine the plurality of contact resistance values based on equation (7) above. In such embodiments, the plurality of voltage and current measurements performed by the parameter measurement circuit 602a comprises a plurality of emission coefficient parameter sets, each emission coefficient parameter set comprising a voltage and a corresponding current associated with the input pin of the DUT 604. Alternately, in other embodiments, the contact resistance estimation circuit 602b may be configured to determine the plurality of contact resistance values based on the predefined contact resistance relation given in equation (19) above. In such embodiments, the plurality of voltage and current measurements performed by the parameter measurement circuit 602a comprises a plurality of emission coefficient parameter sets, each emission coefficient parameter set comprising two different voltage and corresponding two different currents (e.g. two voltage current pairs) associated with the input pin of the DUT 604.

Upon determining the plurality of contact resistance values at the contact resistance circuit 602a, the emission coefficient determination software 602c is configured to determine a resistance difference that comprises a difference between the greatest value and the smallest value of the determined plurality of contact resistance values (e.g., act 312 in FIG. 3a and FIG. 3b). Upon determining the resistance difference, the emission coefficient estimation circuit 602b is configured to determine whether the determined resistance difference fulfills a stop condition (e.g., act 313 in FIG. 3a). The emission coefficient estimation circuit 602c is configured to determine/select the emission coefficient estimate as the final emission coefficient, if the resistance difference fulfills the stop condition (e.g., 315 in FIG. 3a). Further, the emission coefficient estimation circuit 602c is configured to adjust the emission coefficient estimate, if the resistance difference does not fulfill the stop condition (e.g., act 320 in FIG. 3a and FIG. 3b).

In some embodiments, for example, during a first iteration (with the initial emission coefficient estimate), the stop condition comprises determining if the resistance difference is less than or equal to a predefined absolute threshold value $Th_{abs}$ (e.g., act 316 in FIG. 3b). In some embodiments, for example, from a second iteration (with the adjusted emission coefficient estimate), the stop condition comprises determining if the resistance difference is less than or equal to a predefined absolute threshold value $Th_{abs}$ (e.g., act 322 in FIG. 3b). Further, the stop condition comprises determining whether the calculated resistance difference is less than a previous resistance difference at least by a predefined relative threshold value $Th_{relative}$ (e.g., act 324 in FIG. 3b). Furthermore, the stop condition comprises determining whether the previous resistance difference is less than the current resistance difference at least by the predefined relative threshold value $Th_{relative}$ (e.g., act 326 in FIG. 3b). Upon adjusting the emission coefficient estimate, the contact resistance estimation circuit 602b is further configured to determine a plurality of modified contact resistance values based on the adjusted emission coefficient estimate and the emission coefficient determination software 602c is further configured to determine a resistance difference based on the plurality of modified contact resistance values.

In some embodiments, the emission coefficient determination circuit 602c is configured to adjust the emission coefficient estimate until the stop condition is satisfied. In some embodiments, however, the emission coefficient determination circuit 602c may be configured to adjust the emission coefficient estimate until the stop condition is satisfied or until a number of repetitions of the loop exceeds a loop limit value. In such embodiments, the emission coefficient estimation circuit 602c may be configured to increment a loop count to keep track of the number of repetitions of the loop, each time the resistance difference does not fulfill the stop condition (e.g., act 318 and 330 in FIG. 3b) and compare the loop count to an allowed maximum loop limit value (e.g., the act 332 in FIG. 3b). In some embodiments, the emission coefficient estimation circuit is configured to determine a current emission coefficient estimate or the previous emission coefficient as the final emission coefficient of the DUT 604, if the resistance difference satisfies the stop condition (e.g., acts 319, 325 and 327 of FIG. 3b) or the loop count exceeds the maximum allowed loop limit value (e.g., act 334 in FIG. 3b).

In a second, different, embodiment, the test circuit 602 may be configured to determine the emission coefficient associated with an input pin of the DUT, based on implementing the predefined emission coefficient determination method 400 explained above with respect to FIG. 4. In such embodiments, the parameter measurement circuit 602a is configured to perform a plurality of voltage and current measurements (e.g., act 404 in FIG. 4). In some embodiments, the parameter measurement circuit 602a is configured to perform the plurality of voltage and current measurements based on forcing a plurality of currents to the input pin of the DUT 604 and measuring corresponding voltages at the input pin of the DUT 604. However, in other embodiments, the parameter measurement circuit 602a may be configured to perform the plurality of voltage and current measurements based on forcing a plurality of voltages at the input pin of the DUT 604 and measuring corresponding currents at the input pin of the DUT 604.

In some embodiments, the emission coefficient determination circuit 602c is configured to initiate with a plurality of emission coefficient estimates $\eta_1, \eta_2 \ldots \eta_k$ (at least two emission coefficient estimates) and provide the plurality of emission coefficient estimates to the contact resistance estimation circuit 602b (e.g., the act 406 in FIG. 4). In some embodiments, the plurality of emission coefficient estimates $\eta_1, \eta_2 \ldots \eta_k$ is predefined and stored in a memory circuit associated with the emission coefficient determination circuit 602c. Alternately, in other embodiments, the plurality of emission coefficient estimates $\eta_1, \eta_2 \ldots \eta_k$ may be provided to the emission coefficient determination circuit 602c from outside, for example, by an operator. In some embodiments, the contact resistance estimation circuit 602b is configured to determine a plurality of contact resistance values respectively based on the plurality of voltage and current measurements, for each emission coefficient estimate of the plurality of emission coefficient estimates $\eta_1, \eta_2 \ldots \eta_k$ (e.g., the act 408 in FIG. 4). In some embodiments, the contact resistance estimation circuit 602b may be configured to determine the plurality of contact resistance values based on equation (7) above. In such embodiments, the plurality of voltage and current measurements performed by the parameter measurement circuit 602a comprises a plurality of emission coefficient parameter sets, each emission coefficient parameter set comprising a voltage and a corresponding current associated with the input pin of the DUT 604. Alternately, in other embodiments, the contact resistance estimation circuit 602b may be configured to determine the plurality of contact resistance values based on the predefined contact resistance relation given in equation (19) above. In such embodiments, the plurality of voltage and current measurements performed by the parameter measurement circuit 602a comprises a plurality of emission coefficient parameter sets, each emission coefficient parameter set comprising two different voltage and corresponding two different currents associated with the input pin of the DUT 604.

Upon determining the plurality of contact resistance values for each emission coefficient estimate of the plurality of emission coefficient estimates $\eta_1, \eta_2 \ldots \eta_k$, the emission coefficient estimation circuit 602c is configured to determine a resistance difference comprising a difference between a greatest and a smallest value within the plurality of calculated contact resistance values, for each emission coefficient estimate of the plurality of emission coefficient estimates (e.g., act 410 in FIG. 4). Upon determining the resistance differences, the emission coefficient determination circuit 602c is configured to determine a select eta having a smallest resistance difference, from the set of etas (e.g., act 412 in FIG. 4). In some embodiments, the emission coefficient determination circuit 602c is further configured to choose the select eta as the emission coefficient associated with the input pin of the DUT 604 (e.g., act 414 in FIG. 4). In some embodiments, the emission coefficient determination circuit 602c may be configured to tune the select eta, in order to get a more accurate eta value. In such embodiments, the emission coefficient determination circuit 602c may be configured to define another set of etas based on the select eta and the above emission coefficient determination process (e.g., determining the plurality of contact resistances for each eta, determining the resistance difference for each eta and determining the select eta from the new set of etas) is repeated for the new set of etas. In some embodiments, the another set of etas may be obtained by fine tuning the select eta by a predefined step range. In some embodiments, emission coefficient determination circuit 602c may be configured to define new set of etas and repeat the emission coefficient determination process until a desired accuracy for eta is achieved. In some embodiments, the desired accuracy of the emission coefficient may be predefined.

Referring back to FIG. 6, in some embodiments, the test circuit 602 may be further configured to determine a contact resistance at the input pin of the DUT 604. In a first embodiment, the test circuit 602 may be further configured to determine a contact resistance at the input pin of the DUT 604 based on implementing equation (7) above. In order to determine the contact resistance, the parameter measurement circuit 602a is configured to determine a contact resistance parameter set comprising a voltage and a corresponding current associated with the input pin of the DUT 604. Further, the contact resistance circuit 602b is configured to implement the equation (7) based on the determined contact resistance parameter set, and a value of the emission coefficient. In some embodiments, the emission coefficient is determined at the emission coefficient determination circuit 602c based on implementing the methods 300, 350 or 400 as explained above. In such embodiments, the contact resistance circuit 602b may be configured to use a select voltage and current measurement determined at the parameter measurement circuit 602 during the emission coefficient determination process to determine the contact resistance. Alternately, in other embodiments, the emission coefficient may be determined at the emission coefficient determination circuit 602c differently than above, for example, may be provided by an operator or use a predefined value.

In a second embodiment, the test circuit 602 may be further configured to determine a contact resistance at the input pin of the DUT 604 based on implementing the predefined contact resistance relation in equation (19) above. In order to determine the contact resistance based on equation (19), the parameter measurement circuit 602a is configured to measure a contact resistance parameter set comprising two different voltages and corresponding two different currents associated with the input pin of the DUT 604. Further, the contact resistance circuit 602b is configured to implement the equation (19) based on the determined contact resistance parameter set, and a value of an emission coefficient. In some embodiments, the emission coefficient is determined at the emission coefficient determination circuit 602c based on implementing the methods 300, 350 or 400 as explained above. In such embodiments, the contact resistance circuit 602b may be configured to use a select voltage and current measurement determined at the parameter measurement circuit 602 during the emission coefficient determination process, in order to determine the contact resistance. Alternately, in other embodiments, the emission coefficient may be determined at the emission coefficient determination circuit 602c differently than above, for example, may be provided by an operator or use a predefined value.

Figure 7:
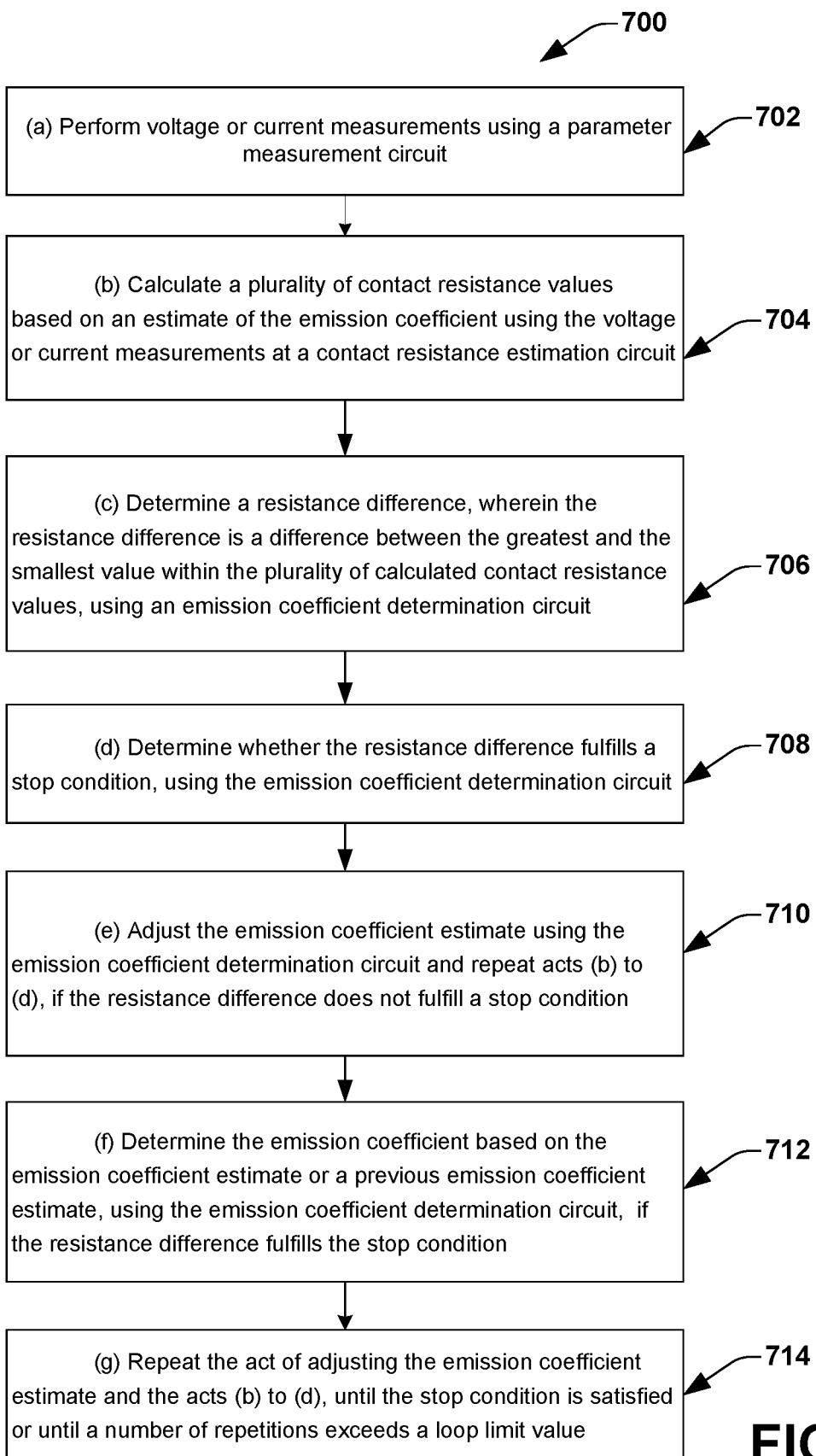
FIG. 7 illustrates a flow chart for a method for determining the emission coefficient of an input/output (to Amulya: it can be an input only, output only or bidirectional pin) pin associated with device under test (DUT), according to one embodiment of the disclosure.

FIG. 7 illustrates a flow chart for a method 700 for determining the emission coefficient of an input pin associated with device under test (DUT), according to one embodiment of the disclosure. In some embodiments, the method 700 corresponds to the emission coefficient determination methods 300 and 350 in FIG. 3a and FIG. 3b, respectively, and can be implemented within the test circuit 100 in FIG. 1 or the test circuit 602 in FIG. 6. The method 700 is equally applicable to any test circuit configured to determine an emission coefficient of an input pin of a DUT. The method 700 is explained herein with reference to the test system 600 in FIG. 6. At 702, a plurality of current and voltage measurements associated with an input pin of a DUT (e.g., the DUT 604) are performed at a parameter measurement circuit (e.g., the parameter measurement circuit 602a). In some embodiments, the plurality of voltage and current measurements may be performed at the parameter measurement circuit based on forcing a plurality of currents into the input pin of the DUT and measuring corresponding voltages at the input pin. Alternately, in other embodiments, the plurality of voltage and current measurements may be performed at the parameter measurement circuit based on forcing a plurality of voltages at the input pin of the DUT and measuring corresponding currents at the input pin of the DUT. At 704, a plurality of contact resistance values is calculated at a contact resistance circuit (e.g., the contact resistance circuit 602b in FIG. 6), based on an estimate of the emission coefficient using the voltage and current measurements. In some embodiments, the plurality of contact resistance values are calculated at the contact resistance estimation circuit based on implementing equation (7) above.

However, in other embodiments, the plurality of contact resistance values is calculated at the contact resistance estimation circuit based on implementing the predefined contact resistance relation in equation (19) above. Further, in other embodiments, the plurality of contact resistance values may be calculated at the contact resistance estimation circuit differently than above. In some embodiments, for example, when the plurality of contact resistance values is calculated based on equation (7), the plurality of current and voltage measurements determined at the parameter measurement circuit comprises a plurality of emission coefficient parameter sets, each emission coefficient parameter set comprising a voltage and a current measurement associated with the input pin of the DUT, as explained above with respect to FIG. 6. However, in other embodiments, for example, when the plurality of contact resistance values is calculated based on equation (19), the plurality of current and voltage measurements determined at the parameter measurement circuit comprises a plurality of emission coefficient parameter sets, each emission coefficient parameter set comprising two different voltages and corresponding two different current measurements associated with the input pin of the DUT, as explained above with respect to FIG. 6.

At 706, a resistance difference comprising a difference between a greatest and a smallest value within the plurality of calculated contact resistance values is determined at an emission coefficient determination circuit (e.g., the emission coefficient estimation circuit 602c in FIG. 6). At 708, a determination whether the resistance difference fulfill a stop condition, is performed at the emission coefficient determination circuit. In some embodiments, the stop condition comprises determining if the resistance difference is less than or equal to a predefined absolute threshold value Thabs. In some embodiments, the stop condition further comprises determining whether the calculated resistance difference is less than a previous resistance difference at least by a predefined relative threshold value $Th_{relative}$. In some embodiments, the stop condition further comprises determining whether the previous resistance difference is less than the current resistance difference at least by the predefined relative threshold value $Th_{relative}$, as explained above with respect to FIG. 6.

At 710, if the resistance difference is determined not to fulfill the stop condition, the emission coefficient estimate is adjusted to form an adjusted emission coefficient estimate. In some embodiments, upon adjusting the emission coefficient estimate, the contact resistance estimation circuit is further configured to calculate a plurality of modified contact resistance values based on the adjusted emission coefficient estimate. In some embodiments, the emission coefficient determination circuit is further configured to determine a resistance difference comprising a difference between a greatest and a smallest value within the plurality of calculated contact resistance values. At 712, if the resistance difference is determined to fulfill the stop condition, the emission coefficient of the DUT is determined based on the current emission coefficient estimate or a previous emission coefficient estimate, at the emission coefficient determination circuit. At 714, adjusting the emission coefficient estimate at the emission coefficient estimation circuit, calculating the plurality of modified contact resistance values based on the adjusted emission coefficient estimate at the contact resistance estimation circuit and determining the resistance difference comprising a difference between a greatest and a smallest value within the plurality of calculated contact resistance values at the emission coefficient determination circuit is repeated, until the stop condition is fulfilled or a loop count reaches a maximum allowed loop limit value at the emission coefficient determination circuit, as explained above with respect to FIG. 6 above.

Figure 8:
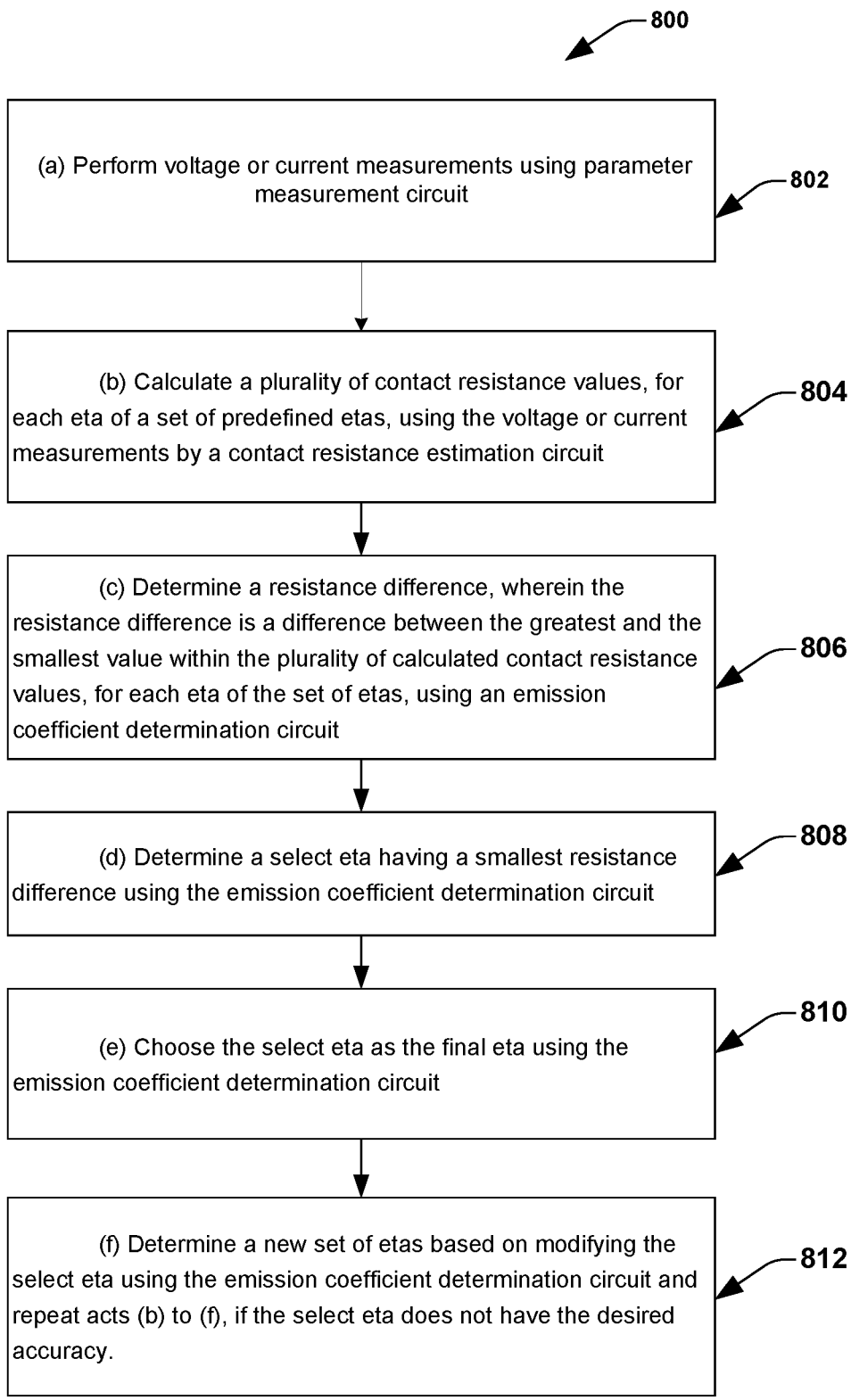
FIG. 8 illustrates a flow chart for a method for determining the emission coefficient of an input/output (to Amulya: it can be an input only, output only or bidirectional pin) pin associated with device under test (DUT), according to one embodiment of the disclosure.

FIG. 8 illustrates a flow chart for a method 800 for determining the emission coefficient of an input pin associated with device under test (DUT), according to one embodiment of the disclosure. In some embodiments, the method 800 corresponds to the emission coefficient determination methods 400 in FIG. 4 and can be implemented within the test circuit 100 in FIG. 1 or the test circuit 602 in FIG. 6. The method 800 is equally applicable to any test circuit configured to determine an emission coefficient of an input pin of a DUT. The method 800 is explained herein with reference to the test system 600 in FIG. 6. At 802, a plurality of current and voltage measurements associated with an input pin of a DUT (e.g., the DUT 604) are performed at a parameter measurement circuit (e.g., the parameter measurement circuit 602a). In some embodiments, the plurality of voltage and current measurements may be performed at the parameter measurement circuit based on forcing a plurality of currents into the input pin of the DUT and measuring corresponding voltages at the input pin. Alternately, in other embodiments, the plurality of voltage and current measurements may be performed at the parameter measurement circuit based on forcing a plurality of voltages at the input pin of the DUT and measuring corresponding currents at the input pin of the DUT. At 804, a plurality of contact resistance values is calculated at a contact resistance circuit (e.g., the contact resistance circuit 602b in FIG. 6), for each emission coefficient of a set of predefined emission coefficients, using the voltage and current measurements.

In some embodiments, the plurality of contact resistance values are calculated at the contact resistance estimation circuit based on implementing equation (7) above. However, in other embodiments, the plurality of contact resistance values is calculated at the contact resistance estimation circuit based on implementing the predefined contact resistance relation in equation (19) above. Further, in other embodiments, the plurality of contact resistance values may be calculated at the contact resistance estimation circuit differently than above. In some embodiments, for example, when the plurality of contact resistance values is calculated based on equation (7), the plurality of current and voltage measurements determined at the parameter measurement circuit comprises a plurality of emission coefficient parameter sets, each emission coefficient parameter set comprising a voltage and a current measurement associated with the input pin of the DUT, as explained above with respect to FIG. 6. However, in other embodiments, for example, when the plurality of contact resistance values is calculated based on equation (19), the plurality of current and voltage measurements determined at the parameter measurement circuit comprises a plurality of emission coefficient parameter sets, each emission coefficient parameter set comprising two different voltages and corresponding two different current measurements associated with the input pin of the DUT, as explained above with respect to FIG. 6.

At 806, a resistance difference comprising a difference between a greatest and a smallest value within the plurality of calculated contact resistance values is determined, for each emission coefficient of the set of emission coefficient, at an emission coefficient determination circuit (e.g., the emission coefficient determination circuit 602c in FIG. 6). At 808, a select emission coefficient having a smallest resistance difference from the set of predefined emission coefficients, is determined at the emission coefficient determination circuit. At 810, the select emission coefficient is chosen as the final emission coefficient, at the emission coefficient determination circuit, if the select emission coefficient has a desired accuracy. At 812, a new set of emission coefficients is determined at the emission coefficient determination circuit based on modifying the select emission coefficient, if the select emission coefficient does not have the required accuracy. In some embodiments, the new set of emission coefficients may be obtained by fine tuning the select emission coefficient by a predefined step range. In some embodiments, upon determining the new set of emission coefficients, the method proceeds to repeat the acts 804 to 812. For example, in such embodiments, the contact resistance circuit is further configured to calculate a plurality of modified contact resistance values, for each emission coefficient of the new set of predefined emission coefficients.

Further, the emission coefficient determination circuit is further configured to determine a resistance difference comprising a difference between a greatest and a smallest value within the plurality of modified contact resistance values is determined, for each emission coefficient of the new set of emission coefficients. Furthermore, the emission coefficient determination circuit is further configured to determine a select emission coefficient having a smallest resistance difference from the new set of emission coefficients. In some embodiments, the emission coefficient determination circuit is configured to determine a new set of emission coefficients based on modifying the select emission coefficient, the contact resistance circuit is configured to calculate the plurality of modified contact resistance values, for each emission coefficient of the new set of predefined emission coefficients, the emission coefficient determination circuit is configured to determine the resistance difference comprising a difference between a greatest and a smallest value within the plurality of modified contact resistance values, and determine a select emission coefficient having a smallest resistance difference from the new set of emission coefficients, until the select emission coefficient reaches a predefined desired accuracy.

Figure 9:
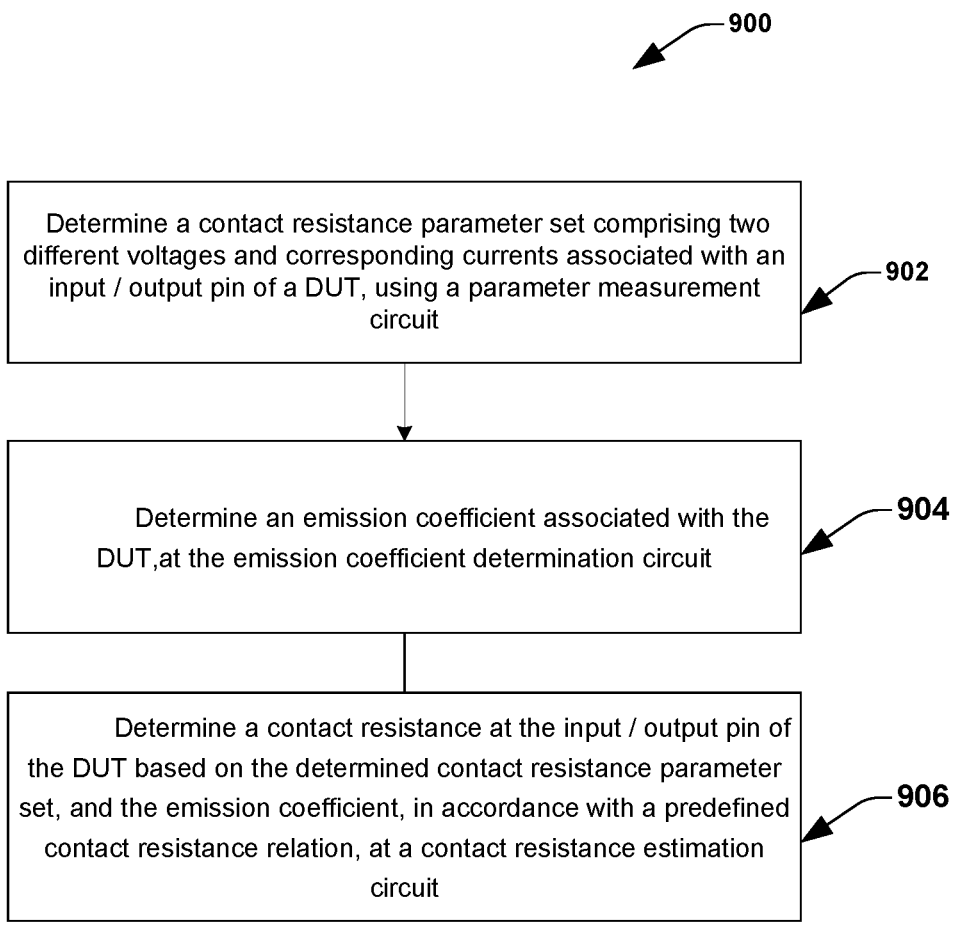
FIG. 9 illustrates a flow chart for a method for determining a contact resistance at an input/output (to Amulya: it can be an input only, output only or bidirectional pin) pin associated with device under test (DUT), according to one embodiment of the disclosure.

FIG. 9 illustrates a flow chart for a method 900 for determining a contact resistance at an input pin associated with device under test (DUT), according to one embodiment of the disclosure. In some embodiments, the method 900 can be implemented within the test circuit 100 in FIG. 1 or the test circuit 602 in FIG. 6. The method 900 is equally applicable to any test circuit configured to determine a contact resistance at an input pin of a DUT. The method 900 is explained herein with reference to the test system 600 in FIG. 6 and the predefined contact resistance relation in equation (19) above. At 902, a contact resistance parameter set comprising two different voltages and corresponding two different currents associated with an input pin of a DUT (e.g., the DUT 604 in FIG. 6) is determined at a parameter measurement circuit (e.g., the parameter measurement circuit 602a in FIG. 6). At 904, an emission coefficient associated with the input pin of the DUT is determined at an emission coefficient determination circuit (e.g., the emission coefficient determination circuit 602c in FIG. 6).

In some embodiments, the emission coefficient associated with the input pin of the DUT is determined at the emission coefficient determination circuit based implementing the emission coefficient method 300, 350 or 400 explained above. However, in other embodiments, the value of the emission coefficient may be predefined or provided by an operator. At 906, a contact resistance at the input pin of the DUT is determined at a contact resistance estimation circuit (e.g., the contact resistance estimation circuit 602b in FIG. 6) based on the determined contact resistance parameter set and the emission coefficient, in accordance with a predefined contact resistance relation (e.g., the predefined contact resistance relation in equation (19) above.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a method for determining an emission coefficient comprising (a) performing voltage and current measurements; (b) calculating a plurality of contact resistance values based on an estimate of the emission coefficient using the voltage and current measurements, (c) determining a resistance difference, wherein the resistance difference is a difference between a greatest and a smallest value within the plurality of calculated contact resistance values, (d) if the resistance difference does not fulfill a stop condition, adjusting the emission coefficient estimate and repeating acts (b) and (c), and (e) if the resistance difference fulfills the stop condition, determining the emission coefficient based on the current emission coefficient estimate or based on a previous emission coefficient estimate.

Example 2 is a method, including the subject matter of example 1, wherein the stop condition is based on a predefined threshold.

Example 3 is a method, including the subject matter of examples 1-2, including or omitting elements, wherein the stop condition is based on the resistance difference and a previously determined resistance difference associated with the previous emission coefficient estimate.

Example 4 is a method, including the subject matter of examples 1-3, including or omitting elements, wherein adjusting the emission coefficient estimate comprises changing the emission coefficient estimate according to a search algorithm dependent on previously determined resistance differences.

Example 5 is a method, including the subject matter of examples 1-4, including or omitting elements, further comprising calculating a contact resistance value based on the determined emission coefficient and at least some of the voltage and current measurements, or further voltage and current measurements.

Example 6 is a method, including the subject matter of examples 1-5, including or omitting elements, further comprising testing a device, wherein a resistance of a physical connection between the device and a test circuit is the basis for the calculated contact resistance.

Example 7 is a method, including the subject matter of examples 1-6, including or omitting elements, wherein adjusting the emission coefficient estimate and the repeating of acts (b) and (c) is repeated until the resistance difference fulfills the stop condition or until a number of repetitions exceeds a loop limit value.

Example 8 is a method for determining an emission coefficient of a device under test (DUT) using a test circuit, comprising coupling a parameter measurement circuit associated with the test circuit to an input pin associated with the DUT, wherein the input pin is coupled to a diode element within the DUT; performing voltage and current measurements associated with the input pin using the parameter measurement circuit; determining a plurality of contact resistance values respectively based on the voltage and current measurements and an emission coefficient estimate using a contact resistance estimation circuit; and determining an emission coefficient associated with the DUT based on the determined plurality of contact resistance values using an emission coefficient determination circuit.

Example 9 is method, including the subject matter of example 8, wherein determining an emission coefficient based on the determined plurality of contact resistance values comprises (a) initiating with the emission coefficient estimate; (b) determining a resistance difference that comprises a difference between a greatest value and a smallest value of the determined plurality of contact resistance values; and (c) selectively adjusting the emission coefficient estimate based on the resistance difference and a stop condition.

Example 10 is method, including the subject matter of examples 8-9, including or omitting elements, wherein selectively adjusting the emission coefficient estimate comprises (d) adjusting the emission coefficient estimate if the resistance difference does not fulfill the stop condition; (e) calculating contact resistance values associated with the adjusted emission coefficient estimate; and (f) determining the emission coefficient based on the emission coefficient estimate or a previous emission coefficient estimate when the resistance difference associated with the emission coefficient estimate fulfills the stop condition.

Example 11 is method, including the subject matter of examples 8-10, including or omitting elements, further comprising repeating acts (d) and (e) if the condition at act (f) is not satisfied until a loop limit value, that iterates each time acts (d) and (e) are repeated, is reached.

Example 12 is method, including the subject matter of examples 8-11, including or omitting elements, wherein the stop condition comprises determining whether the calculated resistance difference is less than or equal to a predefined absolute threshold value.

Example 13 is method, including the subject matter of examples 8-12, including or omitting elements, wherein the stop condition comprises determining whether the calculated resistance difference is less than a previous resistance difference at least by a predefined relative threshold value.

Example 14 is method, including the subject matter of examples 8-13, including or omitting elements, wherein the stop condition comprises determining whether a previous resistance difference is less than the calculated resistance difference at least by a predefined threshold value.

Example 15 is method, including the subject matter of examples 8-14, including or omitting elements, wherein performing voltage and current measurements comprises determining a plurality of emission coefficient parameter sets, each emission coefficient parameter set comprising two different voltages and corresponding two different currents associated with the input pin using the parameter measurement circuit.

Example 16 is method, including the subject matter of examples 8-15, including or omitting elements, wherein determining the plurality of contact resistance values comprises determining the plurality of contact resistance values respectively based on the plurality of emission coefficient parameter sets and the emission coefficient estimate, in accordance with a predefined contact resistance relation using the contact resistance estimation circuit.

Example 17 is a test circuit configured to determine an emission coefficient of a device under test (DUT), comprising a parameter measurement circuit configured to perform voltage and current measurements associated with an input pin of the DUT; a contact resistance estimation circuit configured to determine a plurality of contact resistance values respectively based on the voltage and current measurements and an emission coefficient estimate; and an emission coefficient determination circuit configured to determine an emission coefficient associated with the DUT based on the determined plurality of contact resistance values.

Example 18 is a test circuit, including the subject matter of example 17, wherein, in order to determine the emission coefficient, the emission coefficient determination circuit is configured to (a) initiate with the emission coefficient estimate; (b) calculate a resistance difference comprising a difference between a greatest value and a smallest value of the plurality of contact resistance values; and (c) selectively adjust the emission coefficient estimate based on the resistance difference and a stop condition.

Example 19 is a test circuit, including the subject matter of examples 17-18, including or omitting elements, wherein the stop condition comprises whether the calculated resistance difference is less than or equal to a predefined absolute threshold value.

Example 20 is a test circuit, including the subject matter of examples 17-19, including or omitting elements, wherein the stop condition comprises determining whether the calculated resistance difference is less than a previous resistance difference at least by a predefined relative threshold value.

Example 21 is a test circuit, including the subject matter of examples 17-20, including or omitting elements, wherein the stop condition comprises determining whether a previous resistance difference is less than the calculated resistance difference at least by a predefined threshold value.

Example 22 is a test circuit, including the subject matter of examples 17-21, including or omitting elements, wherein, in order to selectively adjust the emission coefficient estimate, the emission coefficient determination circuit is configured to (d) adjust the emission coefficient estimate when the calculated resistance difference does not fulfill the stop condition; (e) calculate a modified contact resistance difference comprising a difference between a greatest value and a smallest value of a plurality of modified contact resistance values, wherein the plurality of modified contact resistance values is determined at the contact resistance estimation circuit based on the adjusted emission coefficient estimate; and (f) determine the emission coefficient based on the emission coefficient estimate or a previous emission coefficient estimate when the resistance difference associated with the emission coefficient estimate fulfills the stop condition.

Example 23 is a test circuit, including the subject matter of examples 17-22, including or omitting elements, wherein the emission coefficient determination circuit is configured to repeat acts (d) and (e) if the condition at act (f) is not satisfied until a loop limit value, that iterates each time acts (d) and (e) are repeated, is reached.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A method for determining an emission coefficient comprising:
    (a) performing voltage and current measurements associated with an input pin of a device under test (DUT) using a parameter measurement circuit;
    (b) calculating a plurality of contact resistance values using an estimate of the emission coefficient, and the voltage and current measurements, using a contact resistance estimation circuit,
    (c) determining a resistance difference, using an emission coefficient determination circuit, wherein the resistance difference is a difference between a greatest and a smallest value within the plurality of calculated contact resistance values,
    (d) if the resistance difference does not fulfill a stop condition that is based on a predefined threshold value, adjusting the emission coefficient estimate, using the emission coefficient determination circuit and repeating acts (b) and (c),
    (e) if the resistance difference fulfills the stop condition, determining the emission coefficient based on the current emission coefficient estimate or based on a previous emission coefficient estimate, using the emission coefficient determination circuit, and
    (f) storing the determined emission coefficient in a memory circuit for subsequent access in testing or validating the DUT.

2. The method of claim 1, wherein the stop condition is based on the resistance difference and a previously determined resistance difference associated with the previous emission coefficient estimate.

3. The method of claim 1, wherein adjusting the emission coefficient estimate comprises changing the emission coefficient estimate according to a search algorithm dependent on previously determined resistance differences.

4. The method of claim 1, further comprising calculating a contact resistance value based on the determined emission coefficient and at least some of the voltage and current measurements, or further voltage and current measurements.

5. The method of claim 4, further comprising testing a device, wherein a resistance of a physical connection between the device and a test circuit is the basis for the calculated contact resistance.

6. The method of claim 1, wherein adjusting the emission coefficient estimate and the repeating of acts (b) and (c) is repeated until the resistance difference fulfills the stop condition or until a number of repetitions exceeds a loop limit value.

7. A method for determining an emission coefficient of a device under test (DUT) using a test circuit, comprising:
coupling a parameter measurement circuit associated with the test circuit to an input pin associated with the DUT, wherein the input pin is coupled to a diode element within the DUT;
performing voltage and current measurements associated with the input pin using the parameter measurement circuit;
determining a plurality of contact resistance values respectively using the voltage and current measurements, and an emission coefficient estimate using a contact resistance estimation circuit; and
determining the emission coefficient associated with the DUT using the determined plurality of contact resistance values using an emission coefficient determination circuit.

8. The method of claim 7, wherein determining the emission coefficient based on the determined plurality of contact resistance values comprises:
(a) initiating with the emission coefficient estimate;
(b) determining a resistance difference that comprises a difference between a greatest value and a smallest value of the determined plurality of contact resistance values; and
(c) selectively adjusting the emission coefficient estimate based on the resistance difference and a stop condition.

9. The method of claim 8, wherein selectively adjusting the emission coefficient estimate comprises:
(d) adjusting the emission coefficient estimate if the resistance difference does not fulfill the stop condition;
(e) calculating contact resistance values associated with the adjusted emission coefficient estimate; and
(f) determining the emission coefficient based on the emission coefficient estimate or a previous emission coefficient estimate when the resistance difference associated with the emission coefficient estimate fulfills the stop condition.

10. The method of claim 9, further comprising repeating acts (d) and (e) when the condition at act (f) is not satisfied until a loop limit value, that iterates each time acts (d) and (e) are repeated, is reached.

11. The method of claim 9, wherein the stop condition comprises determining whether the determined resistance difference is less than or equal to a predefined absolute threshold value.

12. The method of claim 9, wherein the stop condition comprises determining whether the calculated resistance difference is less than a previous resistance difference at least by a predefined relative threshold value.

13. The method of claim 9, wherein the stop condition comprises determining whether a previous resistance difference is less than the calculated resistance difference at least by a predefined threshold value.

14. The method of claim 8, wherein performing voltage and current measurements comprises determining a plurality of emission coefficient parameter sets, each emission coefficient parameter set comprising two different voltages and corresponding two different currents associated with the input pin using the parameter measurement circuit.

15. The method of claim 14, wherein determining the plurality of contact resistance values comprises determining the plurality of contact resistance values respectively based on the plurality of emission coefficient parameter sets and the emission coefficient estimate, in accordance with a predefined contact resistance relation using the contact resistance estimation circuit.

16. A test circuit configured to determine an emission coefficient of a device under test (DUT), comprising:
a parameter measurement circuit configured to perform voltage and current measurements associated with an input pin of the DUT;
a contact resistance estimation circuit configured to determine a plurality of contact resistance values respectively using the voltage and current measurements and an emission coefficient estimate; and
an emission coefficient determination circuit configured to determine the emission coefficient associated with the DUT using the determined plurality of contact resistance values.

17. The test circuit of claim 16, wherein, in order to determine the emission coefficient, the emission coefficient determination circuit is configured to:
(a) initiate with the emission coefficient estimate;
(b) calculate a resistance difference comprising a difference between a greatest value and a smallest value of the plurality of contact resistance values; and
(c) selectively adjust the emission coefficient estimate based on the resistance difference and a stop condition.

18. The test circuit of claim 17, wherein the stop condition comprises whether the calculated resistance difference is less than or equal to a predefined absolute threshold value.

19. The test circuit of claim 17, wherein the stop condition comprises determining whether the calculated resistance difference is less than a previous resistance difference at least by a predefined relative threshold value.

20. The test circuit of claim 17, wherein the stop condition comprises determining whether a previous resistance difference is less than the calculated resistance difference at least by a predefined threshold value.

21. The test circuit of claim 17, wherein, in order to selectively adjust the emission coefficient estimate, the emission coefficient determination circuit is configured to:
(d) adjust the emission coefficient estimate when the calculated resistance difference does not fulfill the stop condition;
(e) calculate a modified contact resistance difference comprising a difference between a greatest value and a smallest value of a plurality of modified contact resistance values, wherein the plurality of modified contact resistance values is determined at the contact resistance estimation circuit based on the adjusted emission coefficient estimate; and
(f) determine the emission coefficient based on the emission coefficient estimate or a previous emission coefficient estimate when the resistance difference associated with the emission coefficient estimate fulfills the stop condition.

22. The test circuit of claim 21, wherein the emission coefficient determination circuit is configured to repeat acts (d) and (e) if the condition at act (f) is not satisfied until a loop limit value, that iterates each time acts (d) and (e) are repeated, is reached.

\* \* \* \* \*